US 6,903,629 B1

(12) United States Patent
Ballato et al.

(10) Patent No.: US 6,903,629 B1
(45) Date of Patent: Jun. 7, 2005

(54) ELECTRODE-FREE RESONATOR STRUCTURES FOR FREQUENCY CONTROL, FILTERS AND SENSORS

(75) Inventors: Arthur Ballato, Oceanport, NJ (US); John R. Vig, Colts Neck, NJ (US); Yook-Kong Yong, Princeton, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 10/669,282

(22) Filed: Sep. 24, 2003

(51) Int. Cl.[7] .......................... H03H 9/17; H03H 9/205; H03H 9/54; H03H 9/56
(52) U.S. Cl. ...................... 333/187; 333/189; 333/191; 310/367
(58) Field of Search ................................ 333/186–192, 333/200; 310/321, 367

(56) References Cited

U.S. PATENT DOCUMENTS

| | | | | |
|---|---|---|---|---|
| 2,943,279 A | * | 6/1960 | Mattiat ........................ 333/191 |
| 3,432,773 A | * | 3/1969 | Schueler et al. ......... 331/116 R |
| 3,437,848 A | * | 4/1969 | Borner et al. ............... 310/320 |
| 3,576,453 A | * | 4/1971 | Mason ........................ 310/320 |
| 4,625,138 A | * | 11/1986 | Ballato ........................ 310/320 |
| 4,661,201 A | * | 4/1987 | Petridis et al. ................ 216/87 |
| 4,870,313 A | * | 9/1989 | Hirama et al. .............. 310/320 |
| 5,198,716 A | * | 3/1993 | Godshall et al. ............. 310/349 |
| 6,111,341 A | * | 8/2000 | Hirama ........................ 310/365 |
| 6,518,688 B1 | * | 2/2003 | Sasaki ........................ 310/320 |

* cited by examiner

Primary Examiner—Barbara Summons
(74) Attorney, Agent, or Firm—Michael Zelenka; George B. Tereschuk

(57) ABSTRACT

Double-sided, single-sided and ring electrode mesa resonators are provided that operate in the difficult 3 GHZ frequency with an electrode-free resonator area that serves as an energy-trapping area. The double-sided electrode-free resonator device is a double-sided mesa resonator plate, top and bottom wells, a mesa, and top and bottom electrodes deposited in such a way that the electrodes cover the plate surface and surround the mesa, which allows the mesa to protrude above the electrodes and provide an electrode-free resonator area. The top and bottom electrodes, which are acoustically coupled and controlled by acoustic gaps, create an electro-magnetic field and an excitation voltage within a vibrating area of the resonator plate generates an acoustic energy which is trapped within the resonator area and confined to the resonator area to minimize a leakage of the acoustic energy and provide a high Q factor at 3 GHz. The resonator has a resonator frequency determined by a resonator thickness dimension, $t_3$, influences the resonator area's ability to function as an active element trapping the acoustic energy. The inventors herein have observed a strong relationship between decreased resonator thickness and motional impedance. Double-sided and single-sided filter devices based on the same principles are also provided.

54 Claims, 13 Drawing Sheets

$t_2$ = 1.53 μm

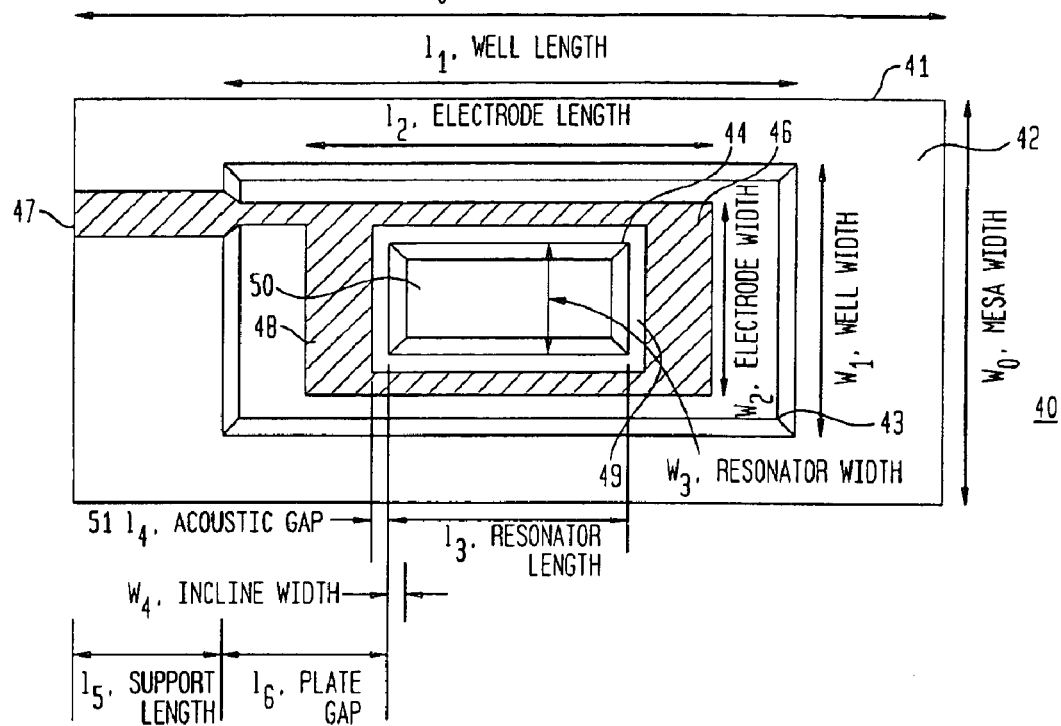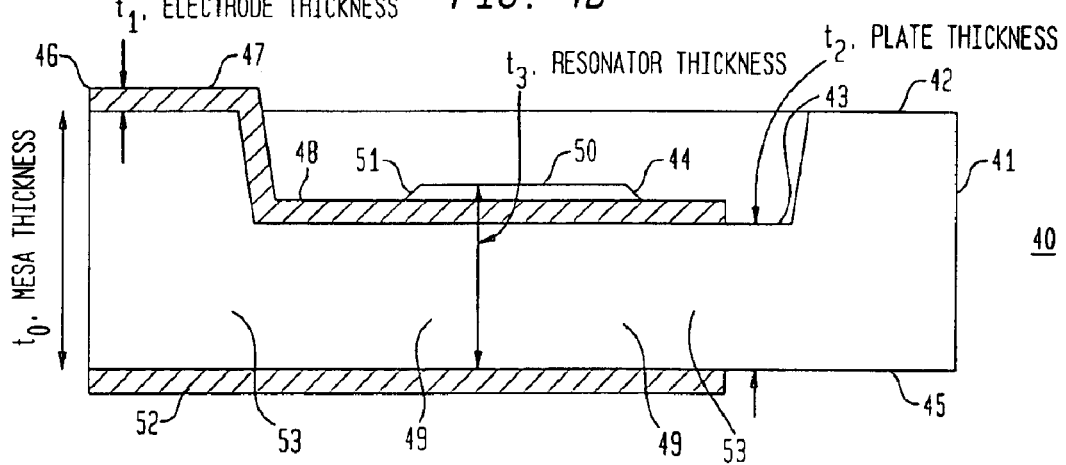

US 6,903,629 B1

ELECTRODE-FREE RESONATOR STRUCTURES FOR FREQUENCY CONTROL, FILTERS AND SENSORS

GOVERNMENT INTEREST

The invention described herein may be manufactured, used, sold, imported and licensed by or for the Government of the United States of America without the payment to us of any royalty thereon.

FIELD OF THE INVENTION

This invention relates generally to the field of piezoelectric resonators. More particularly, this invention relates to electrode-free mesa resonators.

BACKGROUND OF THE INVENTION

The quartz crystal is one of the best studied and most behaved of crystals. Its elastic, piezoelectric and temperature properties are well known, and the sets of material constants are very accurate. Hence, numerical analyses of the frequency and frequency-temperature characteristics of quartz resonators have been remarkably accurate. Engineers with years of experience and experimentation usually design stable quartz crystal resonators. However, there is little experience in designing a stable quartz MEMS thickness shear resonator in the frequency range of 3 GHz because the existing conventional resonators will not operate in that frequency range. A 3 GHz resonator will have an electrode to plate thickness ratio of more than 27% and such a high electrode to plate thickness ratio will degrade the temperature behavior, quality, or A, aging and noise of the resonator.

Thus, there has been a long-felt need for a stable quartz resonator in the frequency range of 3 GHz with an electrode to plate thickness ratio of less than 27% that does not degrade the temperature behavior, Q, aging and noise of the resonator. To satisfy the long-felt need for a 3 GHz stable quartz resonator without suffering from the disadvantages, shortcomings and limitations of prior art techniques and devices, it is necessary to provide new electrode and plate structures. The present invention provides double-sided, single-sided and ring electrode mesa resonators that operate in the difficult 3 GHZ frequency with an advantageous and innovative electrode-free resonator area that separates the electrodes from the resonator structure so that the resonator structure serves as an energy-trapping area, without suffering from the disadvantages, shortcomings and limitations of prior art techniques and devices.

SUMMARY OF THE INVENTION

It is an object of the present invention to provide an electrode-free 3 GHz resonator by positioning the electrode away from the resonator area.

It is a further object of the present invention to provide an electrode-free resonator structure by separating the electrodes from the resonator area by positioning the electrodes away from the resonator so that energy coupling in a vibrating area between the electrodes causes an energy trap for acoustic energy that minimizes energy leakage at the 3 GHz frequency.

It is still another object of the present invention to provide electrode-free mesa resonator structures by separating the electrodes from the resonator area by positioning the electrodes away from the resonator area so that energy coupling in a vibrating area between the electrodes causes an energy trap for acoustic energy that minimizes energy leakage of acoustic energy for a high Q device at the 3 GHz frequency.

These and other objects and advantages are provided by double-sided, single-sided and ring electrode mesa resonators of the present invention, which operate in the difficult 3 GHZ frequency with an advantageous and innovative electrode-free resonator area that serves as an energy-trapping area, without suffering from the disadvantages, shortcomings and limitations of prior art techniques and devices. The double-sided electrode-free resonator device, comprise a double-sided mesa resonator plate, top and bottom wells, a mesa, and top and bottom electrodes deposited in such a way that the electrodes cover the plate surface and surround the mesa, which allows the mesa to protrude above the electrodes and provide an electrode-free resonator area. The top and bottom electrodes, which are acoustically coupled and controlled by acoustic gaps, create an electromagnetic field and an excitation voltage within a vibrating area of the resonator plate, which generates an acoustic energy which is trapped within the resonator area and confined to the resonator area minimizing acoustic energy leakage and provide a high Q factor at 3 GHz.

In the devices of the present invention, the resonator has a resonator frequency determined by a resonator thickness dimension, $t_3$, which influences the resonator area's ability to function as an active element trapping the acoustic energy. The inventors herein have observed a strong relationship between decreased resonator thickness and motional impedance. A stable thickness shear resonator has good energy trapping. The root mean squares (rms) of vibration displacements are employed to characterize the modes of vibration, and the thickness shear mode has a large rms $u_1$ displacement in the $x_1$ direction, or diagonal axis. Rms displacement may be used to compare the energy trapping of the thickness shear mode as a function of the electrode and plate geometry. A high ratio of the rms displacement in the resonator cavity, including the electrodes, to the rms displacement in the outer structure indicates energy trapping. FIGS. 1A–1D are charts illustrating significant aspects of the relationship between decreased resonator thickness and motional impedance in a resonator with a thickness, $t_2$, of 1.65 μm. The ratio of rms displacements is shown in the FIG. 1C graph. The graph is useful for showing resonator dimensions which yield good energy trapping and high Q, such as the length to thickness ratio of 6.25.

For each mode of vibration, the electric flux density $D_2$ at the quartz to electrode interface is integrated over the electrode area to yield the electric current according to the formula:

$$i = {}_A \!\int \omega D_2 dA$$

where ω is resonant frequency in radians per second. For a constant driving voltage, the magnitude of the current is inversely proportional to the motional impedance of the mode. Hence the current as a function of the plate geometry has been employed as a further means for selecting different resonator designs. Modes with zero or small current are not active and may be removed from the frequency spectrum, as is depicted in FIG. 1A graph. Modes having small currents due to charge cancellation or negligible piezoelectric coupling are removed. The FIG. 1B graph shows the current of the modes as a function of the resonator length to thickness ratio. It should be noted that this graph shows the third anharmonic overtone of thickness shear interacting with the main mode for certain length to thickness ratios (example:

5.9 an 6.5). This unwanted interaction is caused not by spurious modes with the main mode but rather by the coupling of the anharmonic mode with other modes. The coupling changes its motional impedance of that of the main mode. The FIG. 1B graph also shows that since the third anharmonic mode has a lower motional impedance it will tend to vibrate unless prevented from doing so by the external circuitry. FIGS. 2A–2D show similar frequency spectra as FIGS. 1A–1D, however, thickness, $t_2$, is now decreased to 1.53 μm. The FIG. 2B graph shows that reducing the resonator length to thickness ratio can decrease the motional impedance of the main mode. This graph also shows that decreasing the thickness, t2, when compared to the FIG. 1B graph can reduce the motional impedance. Thus, a decreased thickness leads to increased coupling with the region under the electrodes, which is disclosed herein as the vibrating area.

The double-sided, single-sided and ring electrode electrode-free mesa resonators of the present invention, which operate in the difficult 3 GHZ, may be used in numerous electronics and communications devices, including frequency control devices, filters and sensors.

BRIEF DESCRIPTION OF THE DRAWINGS

FIGS. 4A–4C are top, cross sectional and bottom views of a single-sided electrode-free resonator in accordance with the present invention;

DETAILED DESCRIPTION OF THE DRAWINGS

Figure 1A:
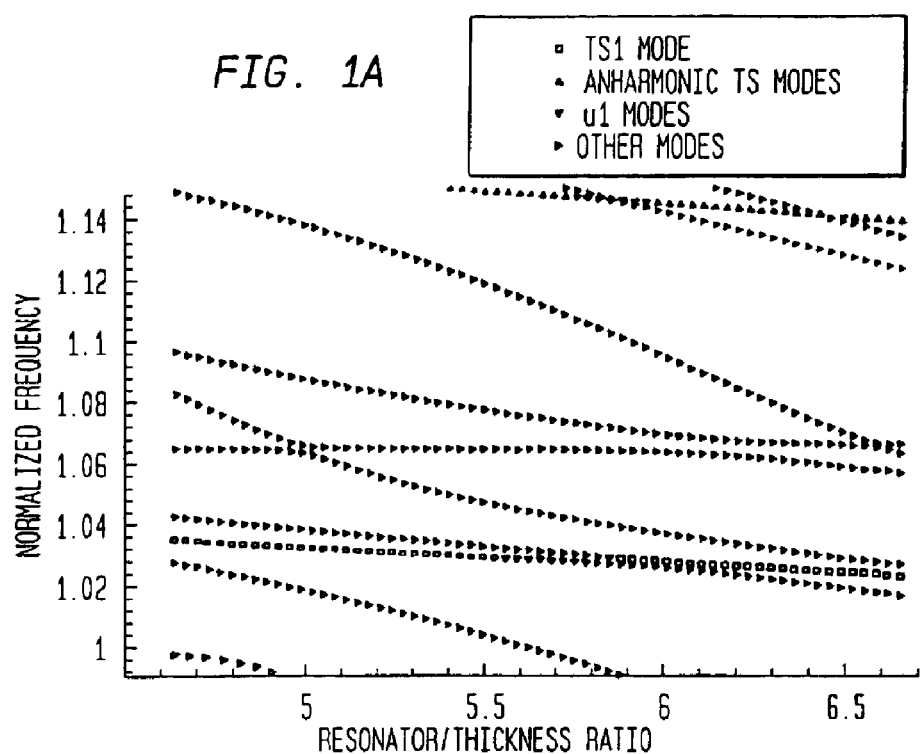
FIGS. 1A–1D are graphs illustrating various aspects of the relationship between decreased resonator thickness and motional impedance in a resonator with a thickness, $t_2$, of 1.65 μm.
Figure 1B:
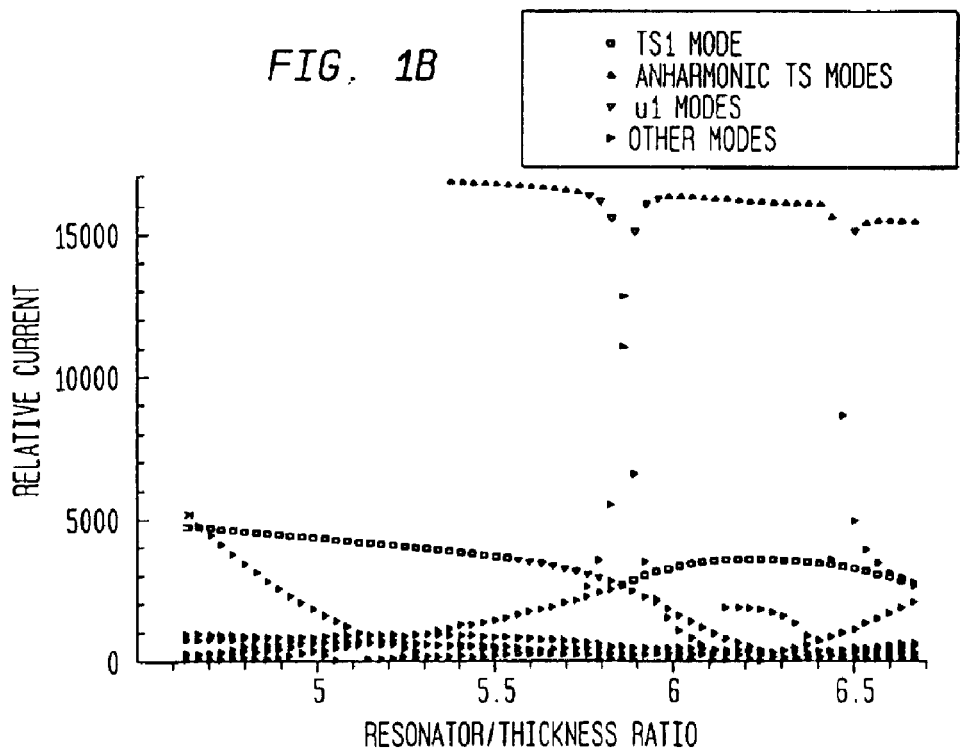
Figure 1C:
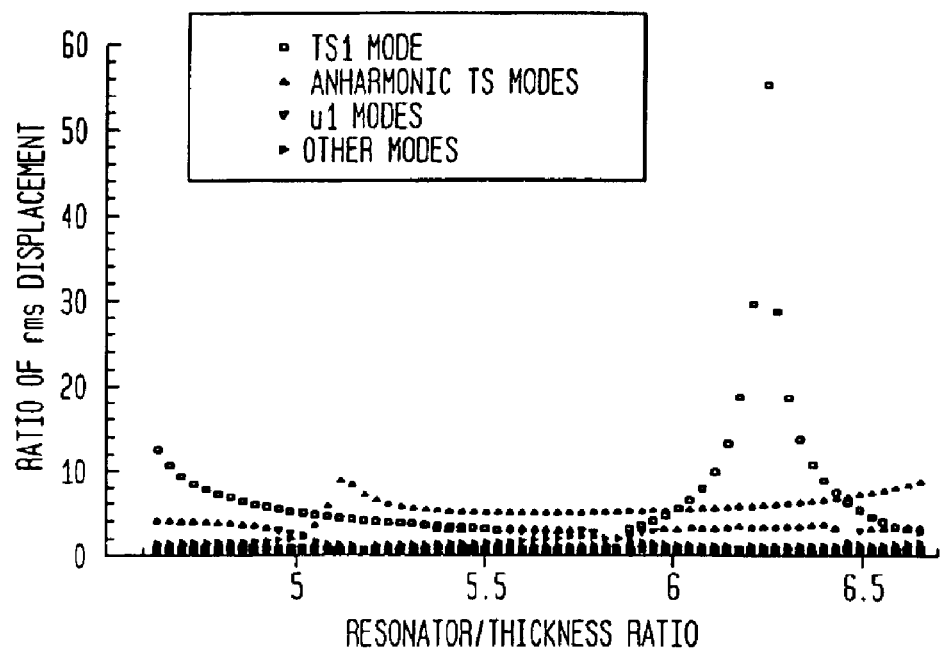
Figure 1D:
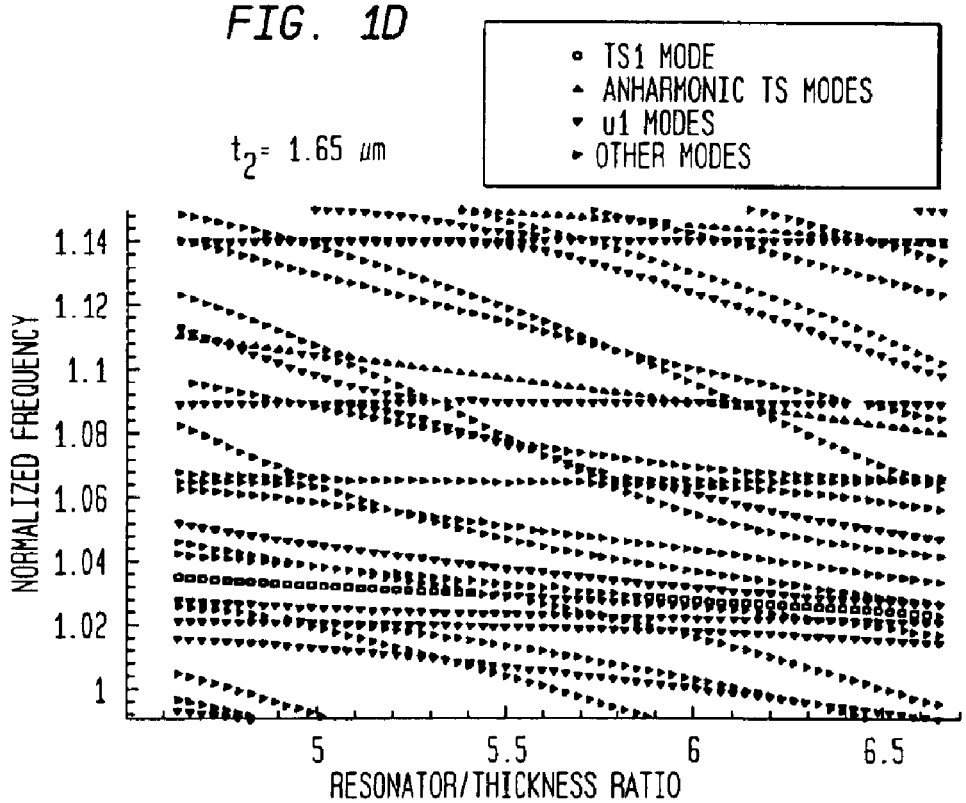
Figure 2A:
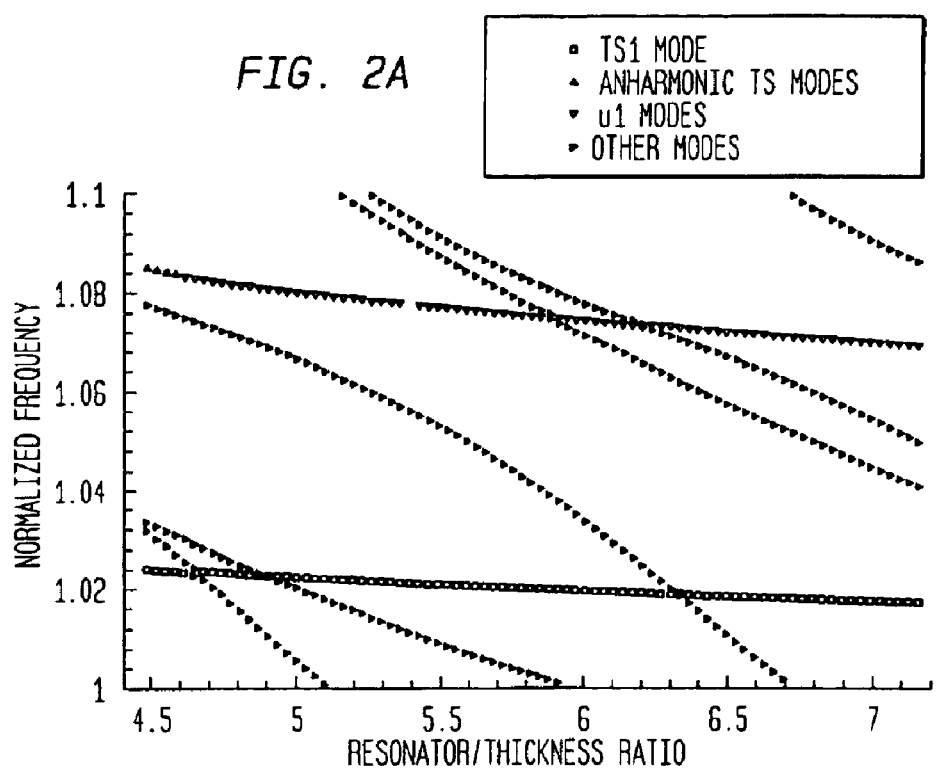
FIGS. 2A–2D are graphs illustrating various aspects of the relationship between decreased resonator thickness and motional impedance in a resonator with a decreased thickness, $t_2$, of 1.53 μm.
Figure 2B:
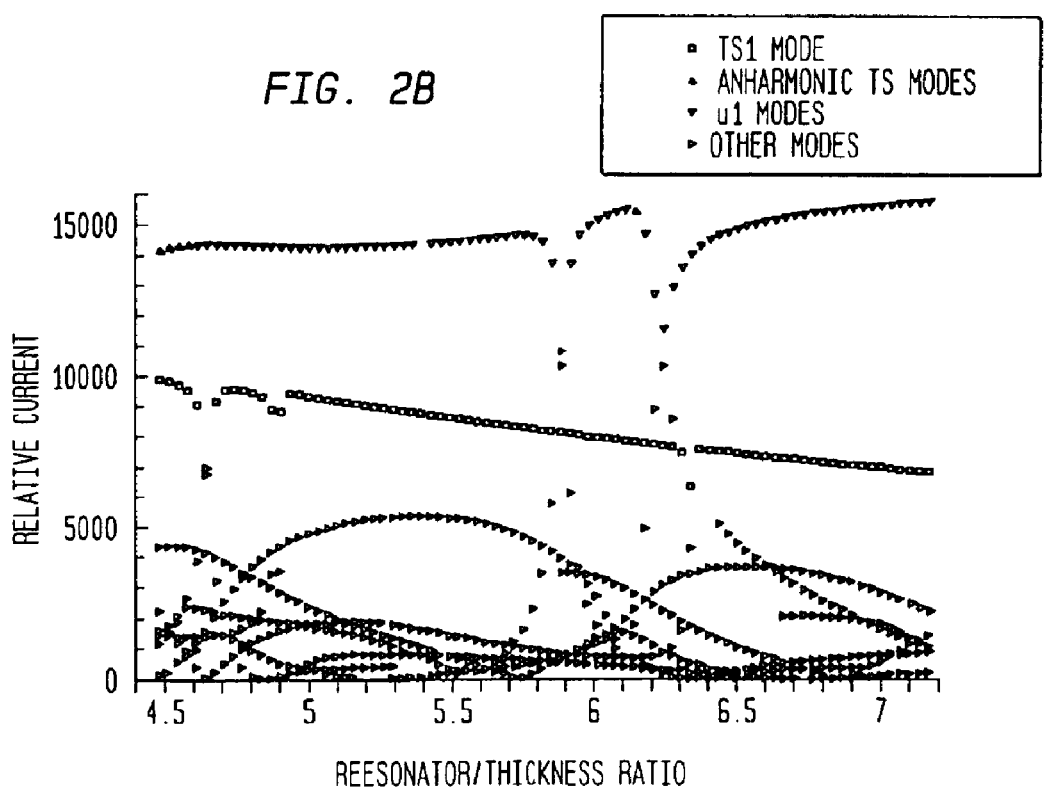
Figure 2C:
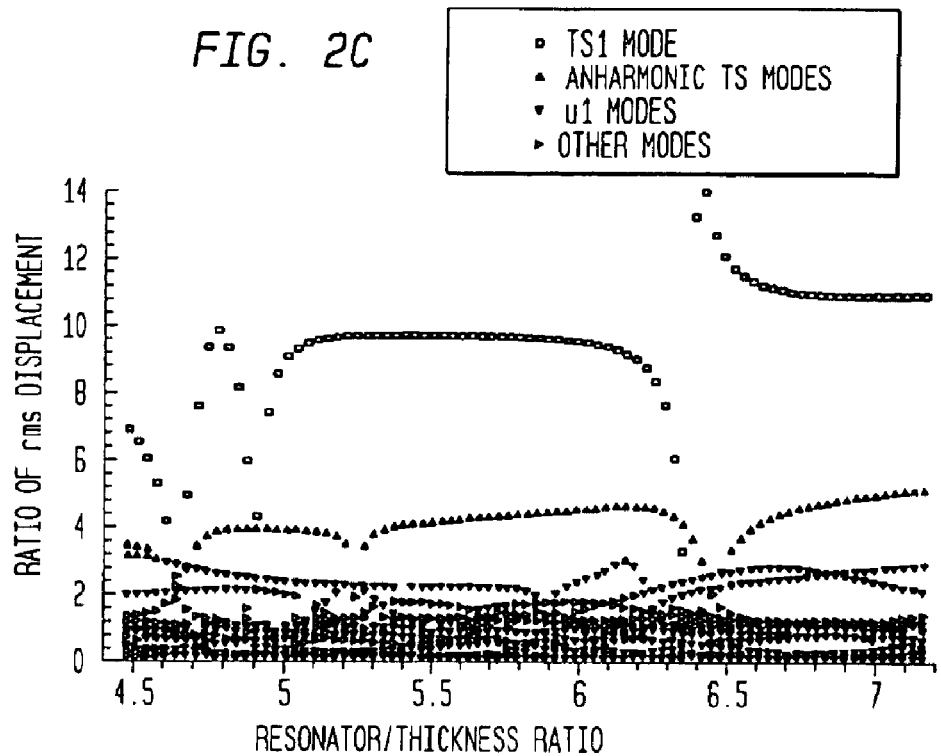
Figure 2D:
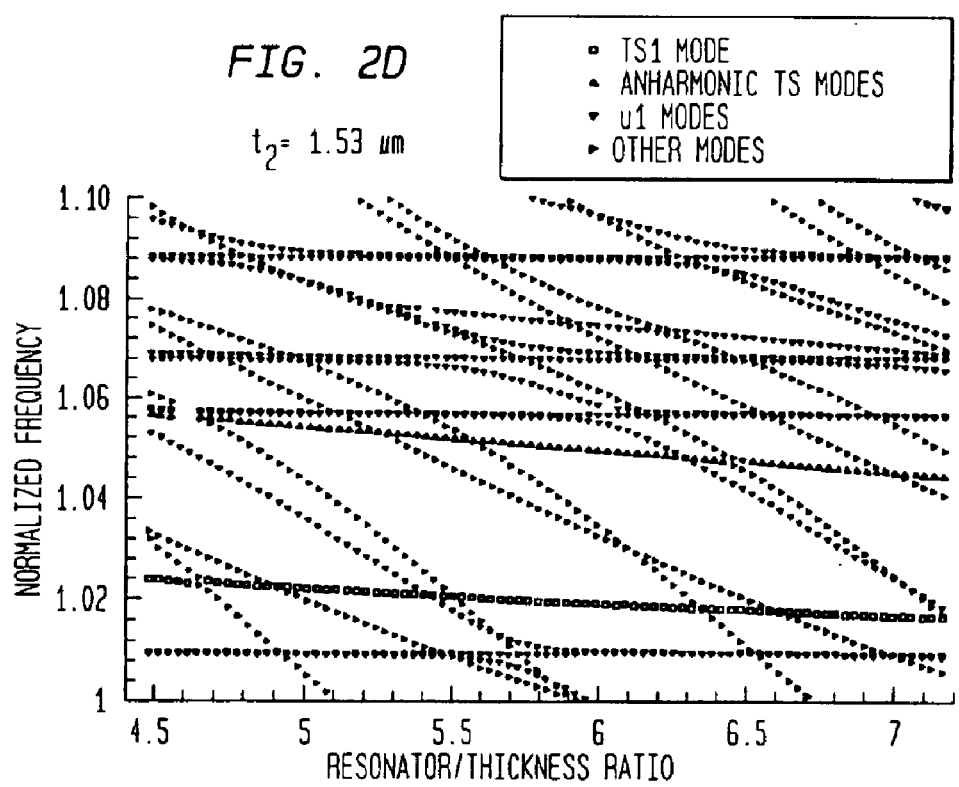
Figure 3A:
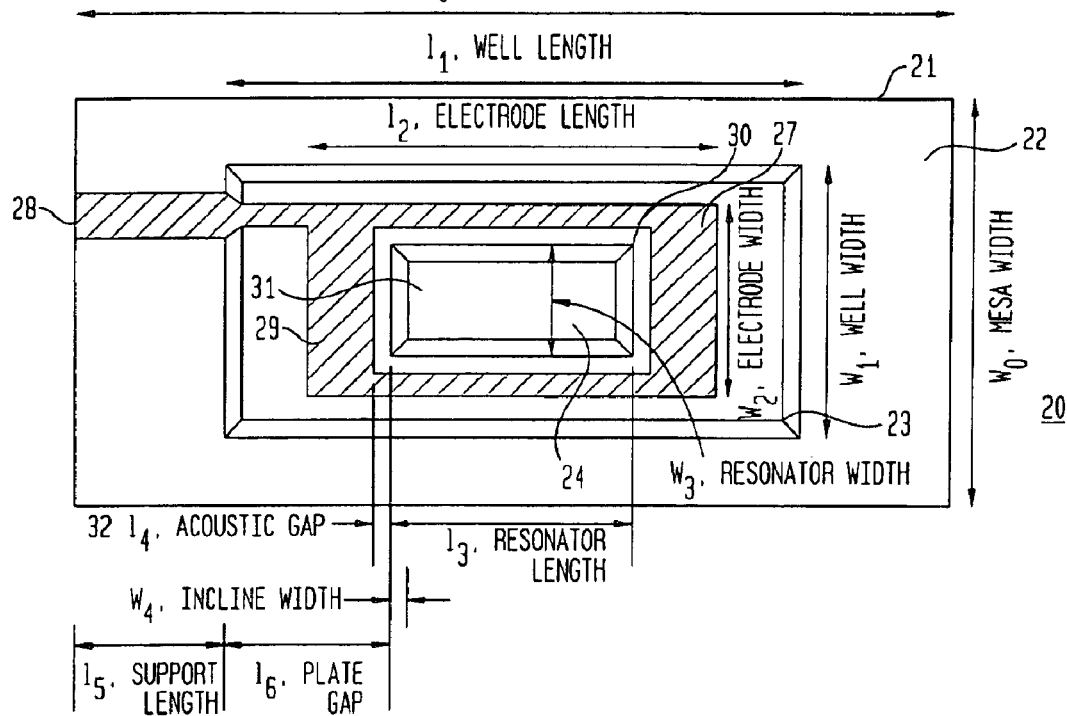
FIGS. 3A–3C are top, cross sectional and bottom views of a double-sided electrode-free resonator in accordance with the present invention.
Figure 3B:
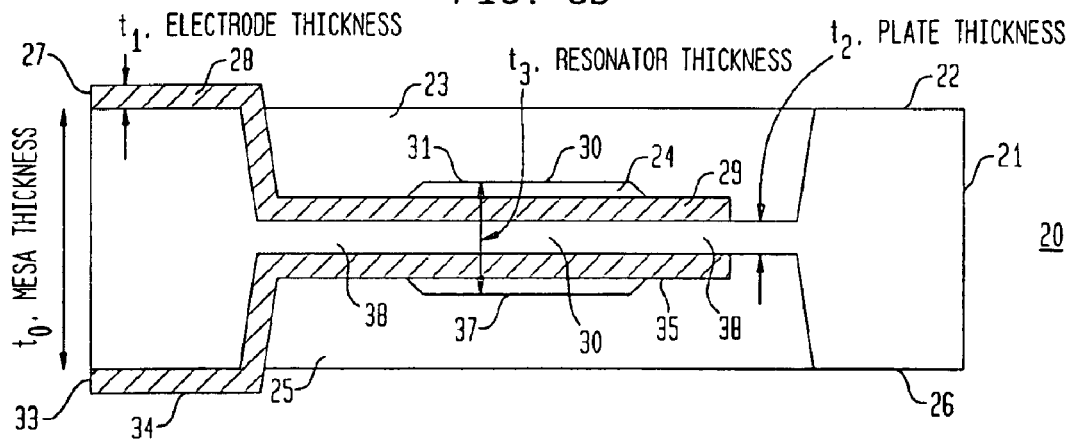
Figure 3C:
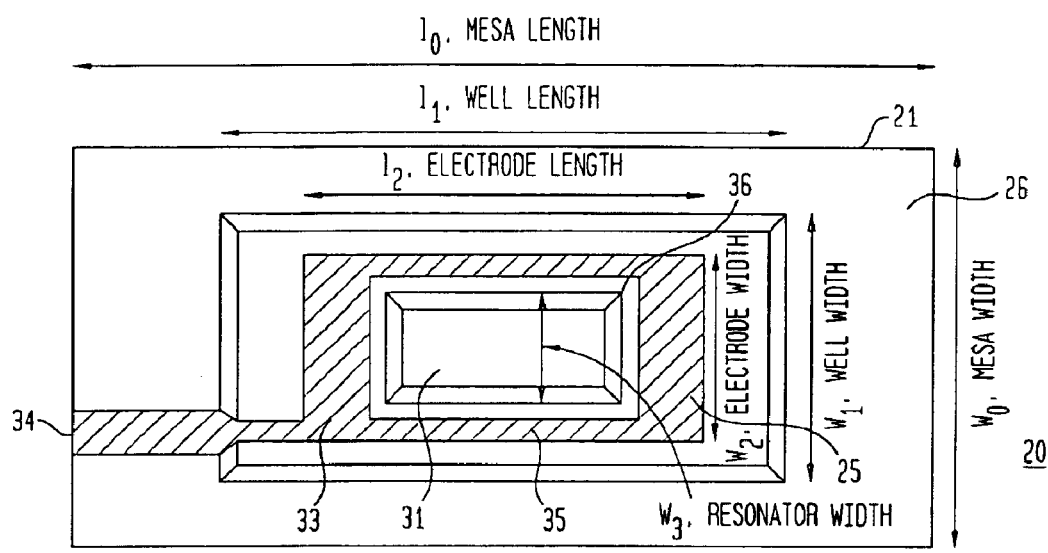

Referring now to the drawings, FIGS. 3A–3C are top, cross sectional and bottom views of the double-sided electrode-free resonator device 20 in accordance with the present invention. FIG. 3A depicts the top view of the double-sided electrode-free resonator device 20, comprising a double-sided mesa resonator plate 21 with a top surface 22, a top well 23, a mesa 24 and a top electrode 27. The top electrode 27 has a top narrow portion 28 disposed on the top surface 22 and a well portion 29 that extends into the top well 23 and surrounds mesa 24, allowing mesa 24 to protrude upwards and provide an electrode-free resonator area 30. A bottom well 25 and bottom surface 26 are depicted in FIG. 3B and not shown in FIG. 3A. A resonator 31 is located in the resonator area 30. The mesa resonator plate 21 supports the resonator 31 and energy is confined to the top well 23 and bottom well 25, shown in FIG. 3B, because the electrode-free resonator area 30 provides an active element where most of the acoustic energy is trapped. The resonator 31 is positioned in the resonator area 30 with an exposed portion of the mesa 24 situated between the resonator 31 and the resonator area 30 defining a first acoustic gap, $l_4$, 32. Resonator 31 has a resonator length, $l_3$, and a resonator width, $w_3$. The electrode length $l_2$ can be greater than the resonator length $l_3$, and the electrode width $w_2$ can be greater than the resonator width $w_3$.

FIG. 3B is a side view of the electrode-free resonator 20, using the same numerals for like structures, and depicts the double-sided mesa resonator plate 21, mesa 24, a bottom well 25 and a bottom surface 26. A bottom electrode 33 with a bottom portion 34 on the bottom surface 26 and a well portion 35 extending into the bottom well 25 the same electrode length, $l_2$, as the top electrode 27 is also provided. Resonator 31 has a resonator thickness dimension, $t_3$, which is measured from a top portion 36 of mesa 24 to a bottom portion 37 of mesa 24. FIG. 3B also depicts a vibrating region 38 generally between the top electrode 27 and bottom electrode 33 and adjacent to resonator area 30. Also depicted are the mesa thickness $t_0$, an electrode thickness $t_1$, a plate thickness $t_2$ and resonator thickness $t_3$. The resonator thickness dimension $t_3$ primarily determines the resonator frequency.

FIG. 3C depicts the bottom view of the electrode-free resonator 20, using the same numerals for like structure. The bottom electrode 33 is located on the bottom surface 26 with a bottom narrow portion 34 and bottom well portion 35 that extends into the bottom well 25. The bottom electrode 33 has the same electrode length, $l_2$, as the top electrode 27. Just as in FIG. 3A, the resonator 31 is positioned in the resonator area 30 with an exposed portion of the mesa 24 situated between the resonator 31 and the resonator area 30 defining a second acoustic gap, $l_4$, 36. FIGS. 3A–3C also depict a number of dimensions of the electrode-free resonator 20, such as mesa length $l_0$, mesa width $w_0$, well length $l_1$, well width $w_1$, electrode length $l_2$, electrode width $w_2$ and so on.

In operation, the top electrode 27 and bottom electrode 33, being acoustically coupled and controlled by the first and second acoustic gaps, $l_4$, 32 and 36, respectively, generate an electro-magnetic field between the electrodes causing an excitation voltage within vibrating area 38 of the resonator plate 21 that generates an acoustic energy within resonator plate 21. The resonator thickness dimension, t3, determines the resonator frequency of the resonator 31. Electrode-free resonator area 30 provides an active element to trap acoustic energy and confine the acoustic energy to the resonator area 30, which minimizes acoustic energy leakage and provides a high Q factor (of about 3,000 to 7,000 Q) at 3 GHz.

A number of variations of the single-sided electrode-free resonator are within the contemplation of this invention, including adjusting the resonator thickness dimension, $t_3$, to vary the resonator frequency, fabricating the single-sided monolithic resonator plate 21 with an etching process, and using quartz or a quartz crystal.

Figure 4C:
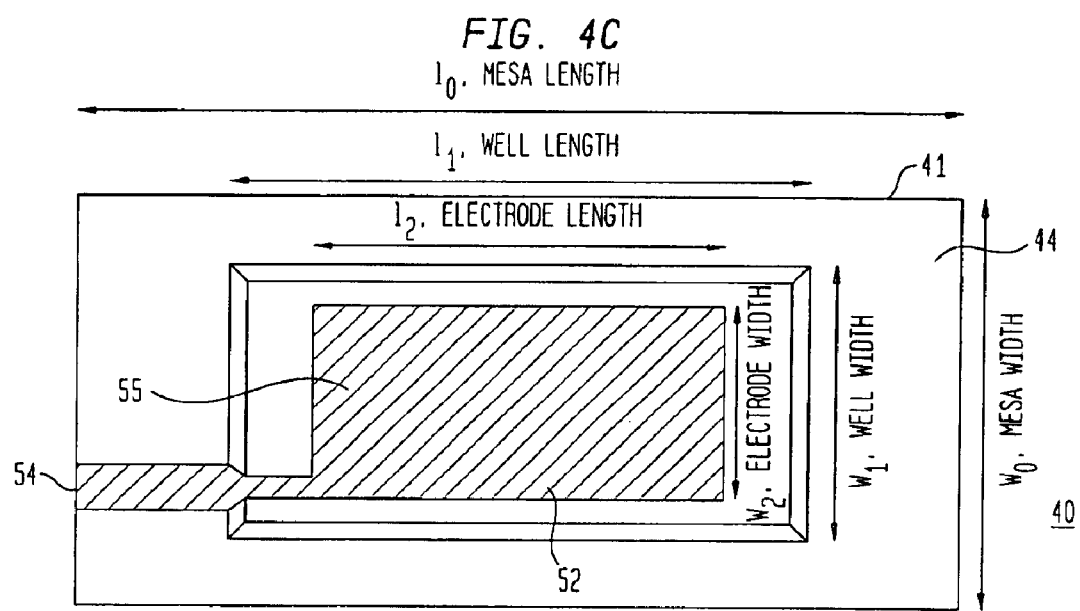

Referring now to the drawings, FIGS. 4A–4C are top, cross sectional and bottom views of a single-sided embodiment of an electrode-free resonator device 40 in accordance with the present invention. FIG. 4A depicts the top view of the single-sided electrode-free resonator 40, comprising a single-sided monolithic mesa resonator plate 41 with a top surface 42, a well 43, a mesa 44, a bottom surface 45, not shown in FIG. 4A, a top electrode 46 with a top narrow portion 47 disposed on the top surface 42 and a well portion 48 that extends into the well 43. The top electrode 46 is deposited on the top surface 42 into the well 43 surrounding the mesa 44, allowing the mesa 44 to protrude upwards and provide an electrode-free resonator area 49. A resonator 50 is located in the resonator area 49. The mesa resonator plate 41 supports the resonator 50 and all energy is confined to well 43 because the electrode-free resonator area 49 provides an active element where most of the acoustic energy is trapped. The resonator 50 is positioned in the resonator area 49 with an exposed portion of the mesa situated between the resonator 50 and resonator area 49 defining an acoustic gap $l_4$, 51. Resonator 50 has a resonator length, $l_3$, and a resonator width, $w_3$. The electrode length $l_2$ can be greater than side resonator length $l_3$, and the electrode width $w_2$ can be greater than the resonator width $w_3$.

FIG. 4B is a side view of the single resonator alternate embodiment of the electrode-free resonator 40, using the same numerals for like structures, and depicts mesa resonator plate 41, top surface 42, well 43, mesa 44, bottom surface 45. A bottom electrode 52 is disposed on the bottom surface 45 and extends the same electrode length $l_2$ as the top electrode 46. Resonator 50 has a resonator thickness dimension, $t_3$, which is measured from the resonator 50 to the bottom surface 45. FIG. 4B also depicts a vibrating region 53 generally between the top electrode 46 and bottom electrode 52 and adjacent to the resonator area 49. In this embodiment, only a single resonator 50 is located on a single side of mesa 44. Also depicted are the mesa thickness $t_0$, an electrode thickness $t_1$, a plate thickness $t_2$ and resonator thickness $t_3$. As in the first resonator embodiment, the resonator thickness dimension $t_3$ primarily determines the resonator frequency.

FIG. 4C depicts the bottom view of the single resonator alternate embodiment of the electrode-free resonator 40, using the same numerals for like structures. The bottom electrode 52 is flat and is located on the bottom surface 44 with a narrow portion 54 and a wide portion 55. Bottom electrode 52 extends along the bottom surface 45 the same electrode length $l_2$ as the top electrode 46. A number of dimensions that are depicted in FIGS. 4A–4C include mesa length $l_0$, mesa width $w_0$, well length $l_1$, well width $w_1$, electrode length $l_2$, electrode width $w_2$ and so on.

In operation, the acoustically coupled top and bottom electrodes 46 and 53, respectively, are controlled by the acoustic gap $l_4$, 51, and generate an electro-magnetic field between them causing an excitation voltage within vibrating area 53 that generates an acoustic energy within the mesa resonator plate 41. The resonator frequency of resonator 50 is determined by the resonator thickness dimension, $t_3$, and the resonator area 49 traps acoustic energy, causing the acoustic energy to be confined to the resonator area 49 to minimize a leakage of acoustic energy and provide a high Q factor at 3 GHz.

A number of variations of the single-sided electrode-free resonator are within the contemplation of this invention, including adjusting the resonator thickness dimension, $t_3$, to vary the resonator frequency, fabricating the single-sided monolithic resonator plate 41 with an etching process, and using quartz or a quartz crystal.

Figure 5A:
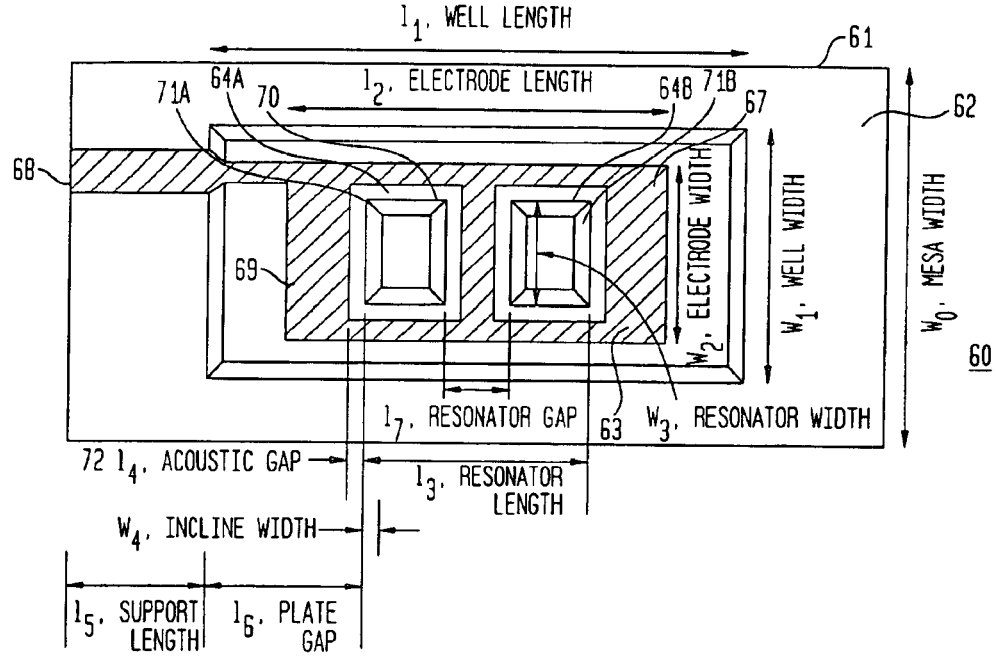
FIGS. 5A–5C are top, cross sectional and bottom views of an double-sided electrode-free filter structure in accordance with the present invention.
Figure 5B:
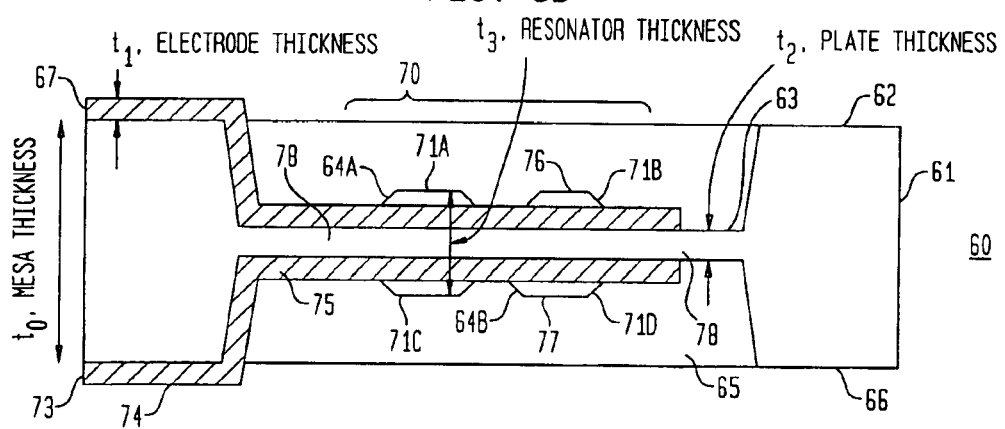
Figure 5C:
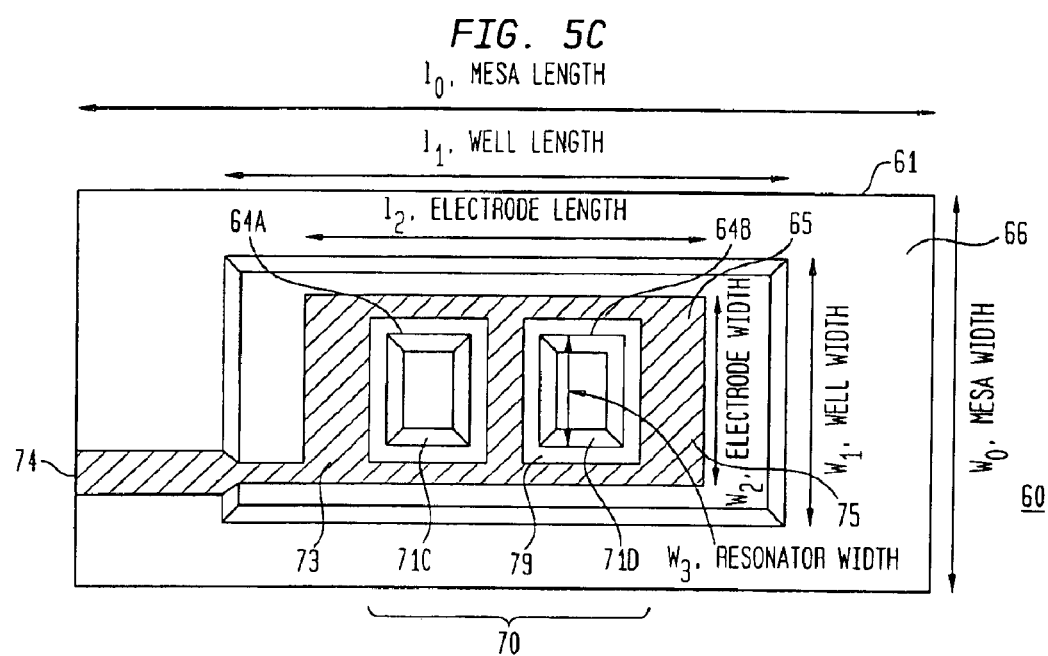

Referring now to the drawings, FIGS. 5A–5C are top, cross sectional and bottom views of the double-sided embodiment of the electrode-free filter device 60 in accordance with the present invention. FIG. 5A depicts the top view of the double-sided electrode-free filter device 60, comprising a double-sided mesa resonator plate 61 with a top surface 62, a top well 63, a pair of mesas 64A and 64B and a top electrode 67. The top electrode 67 has a narrow top portion 68 disposed on the top surface 62 and a well portion 69 that extends into the top well 63 and surrounds the mesas 64A and 64B, allowing the pair of mesas 64A and 64B to protrude upwards and provide an electrode-free resonator area 70. A bottom well 65 and bottom surface 66 are depicted in FIG. 5B and not shown in this drawing. Filters 71A and 71B are located in the resonator area 70. The mesa resonator plate 61 supports the filters 71A and 71B and all energy is confined to top well 63 and bottom well 65, shown in FIG. 5B, because the resonator area 70 provides an active element where most of the energy is trapped. The filters 71A and 71B are positioned in the resonator area 70 with an exposed portion of mesas 64A and 64B situated between the filters 71A and 71B and the resonator area 70 defining a first acoustic gap, $l_4$, 72. Filters 71A and 71B have a resonator length, $l_3$, and a resonator width, $w_3$. In electrode length $l_2$ can be greater than the resonator length, $l_3$, and the electrode width, $w_2$, can be greater than the resonator width $w_3$.

FIG. 5B is a side view of the electrode-free filter structure 60, using the same numerals for like structures, and depicts double-sided mesa resonator plate 61, mesas 64A and 64B, bottom well 65 and a bottom surface 66. A bottom electrode 73 with a bottom portion 74 disposed on the bottom surface 66 and a well portion 75 extending into the bottom well 65 the same electrode length, $l_2$, as the top electrode 67. Filters 71A, 71B, 71C and 71D are located in resonator area 70. Filters 71A and 71C and filters 71B and 71D have a resonator thickness, $t_3$, which is measured from a top portion 76 to a bottom portion 77 of mesas 64A and 64B to a bottom portion 77. FIG. 5B also depicts a vibrating region 78 generally between the top electrode 67 and bottom electrode 73 and adjacent to resonator area 70. Also depicted are the mesa thickness, $t_0$, an electrode thickness, $t_1$, a plate thickness, $t_2$, and resonator thickness, $t_3$. It is noted that the resonator thickness dimension, $t_3$, primarily determines the resonator frequency Just as in FIG. 5A, filters 71C and 71D are located on an electrode-free resonator area 70 on the surface of the well portion 75 of bottom electrode 73. FIGS. 5A–5C also depict a number of dimensions of the electrode-free filter structure 60, such as mesa length $l_0$, mesa width $w_0$, well length, $l_1$, well width, $w_1$, electrode length, $l_2$, electrode width, $w_2$, a resonator gap, $l_7$, between filters 71A and 71B and between 71C and 71D and so on.

FIG. 5C depicts the bottom view of the electrode-free filter structure 60, using the same numerals for like structures. The bottom electrode 73 is located on the bottom surface 66 with a bottom narrow portion 74 and bottom well portion 75 that extends into the bottom well 65 and surrounds the mesas 64A and 64B, allowing the pair of mesas 64A and 64B to protrude downwards and provide part of the electrode-free resonator area 70. The bottom electrode 73 has the same electrode length, $l_2$, as the top electrode 67. Just as in FIG. 5A, the filters 71C and 71D are positioned in the resonator area 70 with an exposed portion of the mesas 64A and 64B situated between the filters 71C and 71D and the resonator area 70 defining a second acoustic gap, $l_4$, 79. FIGS. 5A–5C also depict a number of dimensions of the electrode-free resonator 60, such as mesa length, $l_0$, mesa width, $w_0$, well length, $l_1$, well width, $w_1$, electrode length, $l_2$, electrode width, $w_2$ and so on. Filters 71C and 71D are located within the area defined by resonator length $l_3$ and resonator width $w_3$.

In operation, the acoustically coupled top and bottom electrodes 67 and 73, respectively, are controlled by the first and second acoustic gaps, $l_4$, 72 and 79, respectively, and generate an electro-magnetic field between them causing an excitation voltage within vibrating area 78 that generates an acoustic energy within the double-sided mesa resonator plate 61. Resonator frequency of the filters 71A, 71B, 71C and 71D are determined by the resonator thickness dimension, $t_3$, and the resonator area 70 traps acoustic energy, causing the acoustic energy to be confined to the resonator area 70 to minimize a leakage of acoustic energy and provide a high Q factor at 3 GHz.

In general, the variations that apply to the other resonator embodiments also apply to the double-sided electrode-free filter.

Figure 6A:
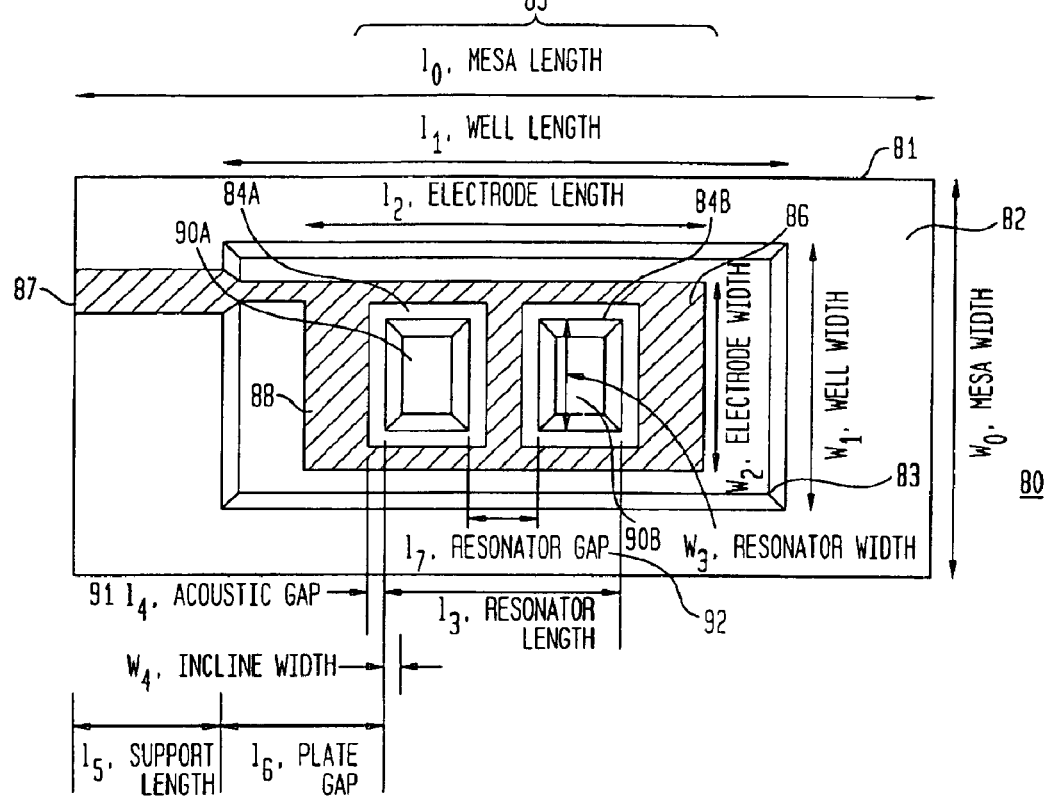
FIGS. 6A–6C are top, cross sectional and bottom views of a single-sided electrode-free filter structure in accordance with the present invention.
Figure 6B:
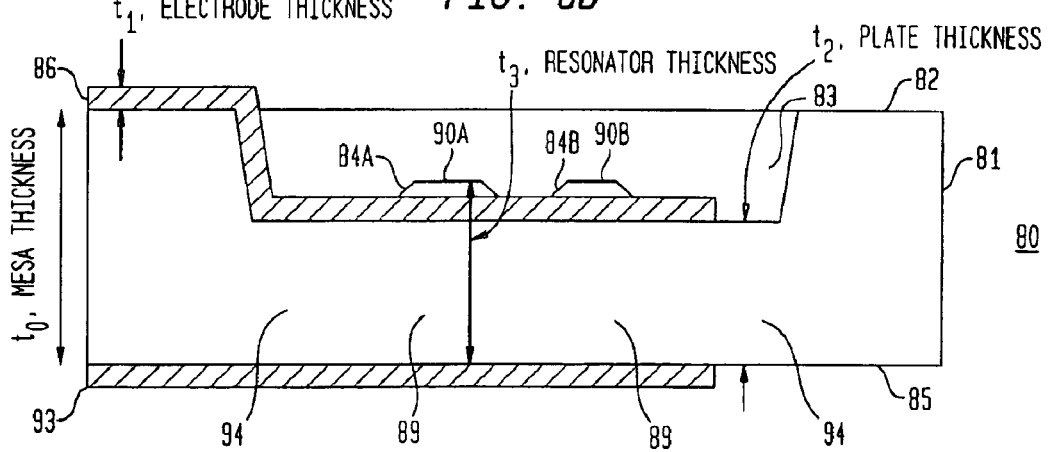
Figure 6C:
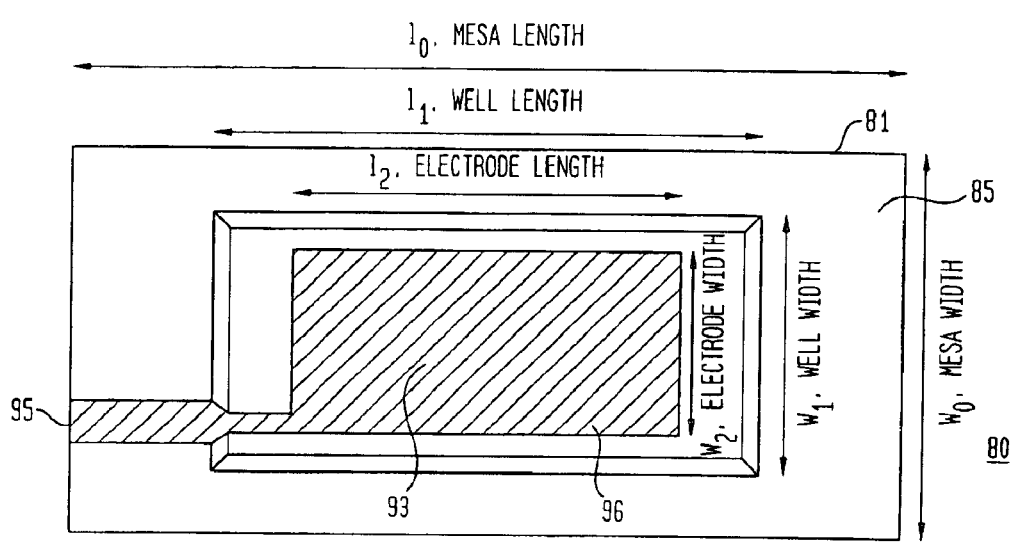

Referring now to the drawings, FIGS. 6A–6C are top, cross sectional and bottom views of a single-sided embodiment of the electrode-free filter device 80 in accordance with the present invention. FIG. 6A depicts the top view of the single-sided electrode-free filter device 80, comprising a single-sided monolithic mesa resonator plate 81 with a top surface 82, a well 83, a pair of mesas 84A and 84B, a bottom surface 85, not shown in FIG. 6A, a top electrode 86 with a top narrow portion 87 disposed on the top surface 82 and a well portion 88 that extends into the well 83. The top electrode 86 is deposited on the top surface 82 into the well 83 surrounding the pair of mesas 84A and 84B, allowing the mesas 84A and 84B to protrude upwards and provide an electrode-free resonator area 89. A pair of filters 90A and 90B is located in the resonator area 89. The single-sided mesa resonator plate 81 supports the filters 90A and 90B and all energy is confined to well 83 because the electrode-free resonator area 89 provides an active element where most of the acoustic energy is trapped. The filters 90A and 90B are positioned in the resonator area 89 with an exposed portion of the mesa situated between the filters 90A and 90B and resonator area 89 defining an acoustic gap, $l_4$, 91. Filters 90A and 90B are separated by a resonator gap, $l_7$, 92. Filters 90A and 90B have a resonator length, $l_3$, and a resonator width, $w_3$. The electrode length $l_2$ can be greater than the resonator length $l_3$, and the electrode width $w_2$ can be greater than the resonator width $w_3$.

FIG. 6B is a side view of the single-sided electrode-free filter device 80, using the same numerals for like structures, and depicts monolithic single-sided mesa resonator plate 81, top surface 82, well 83, a pair of mesas 84A and 84B and a bottom surface 85. A bottom electrode 93 is disposed on the bottom surface 84 that extends the same electrode length $l_2$ as the top electrode 86. Filters 90A and 90B each have a resonator thickness dimension, $t_3$, which is measured from the filters 90A and 90B to the bottom surface 85. FIG. 6B also depicts a vibrating region 94 generally between the top electrode 86 and bottom electrode 93 and adjacent to the resonator area 89. In this drawing, only two filters 90A and 90B are depicted as located on a single side of mesa 84, however, a greater or lesser number of filters are also considered to be within the contemplation of this invention. Also depicted are the mesa thickness $t_0$, an electrode thickness $t_1$, a plate thickness $t_2$ and resonator thickness $t_3$. As in the first filter embodiment, the resonator thickness dimension $t_3$ primarily determines the resonator frequency.

FIG. 6C depicts the bottom view of the single-sided electrode-free filter device 80, using the same numerals for like structures. The bottom electrode 93 is flat and is located on the bottom surface 85 with a narrow bottom portion 95 and a wide bottom portion 96. Bottom electrode 93 extends along the bottom surface 85 the same electrode length $l_2$ as the top electrode 86. FIGS. 6A–6C also depict a number of dimensions of the single-sided electrode-free filter device 80, such as mesa length $l_0$, mesa width $w_0$, well length $l_1$, well width $w_1$, electrode length $l_2$ and electrode width $w_2$ and so on.

In operation, the acoustically coupled top and bottom electrodes 86 and 93, respectively, are controlled by the acoustic gap, $l_4$, 91, and generate an electro-magnetic field between them causing an excitation voltage within vibrating area 94 that generates an acoustic energy within the mesa resonator plate 81. Resonator frequency of the filters 90A and 90B are determined by the resonator thickness dimension, $t_3$, and the resonator area 89 traps acoustic energy, causing the acoustic energy to be confined to the resonator area 89 to minimize a leakage of acoustic energy and provide a high Q factor at 3 GHz.

In general, the variations that apply to the other resonator and filter embodiments also apply to the single-sided electrode-free filter.

Figure 7A:
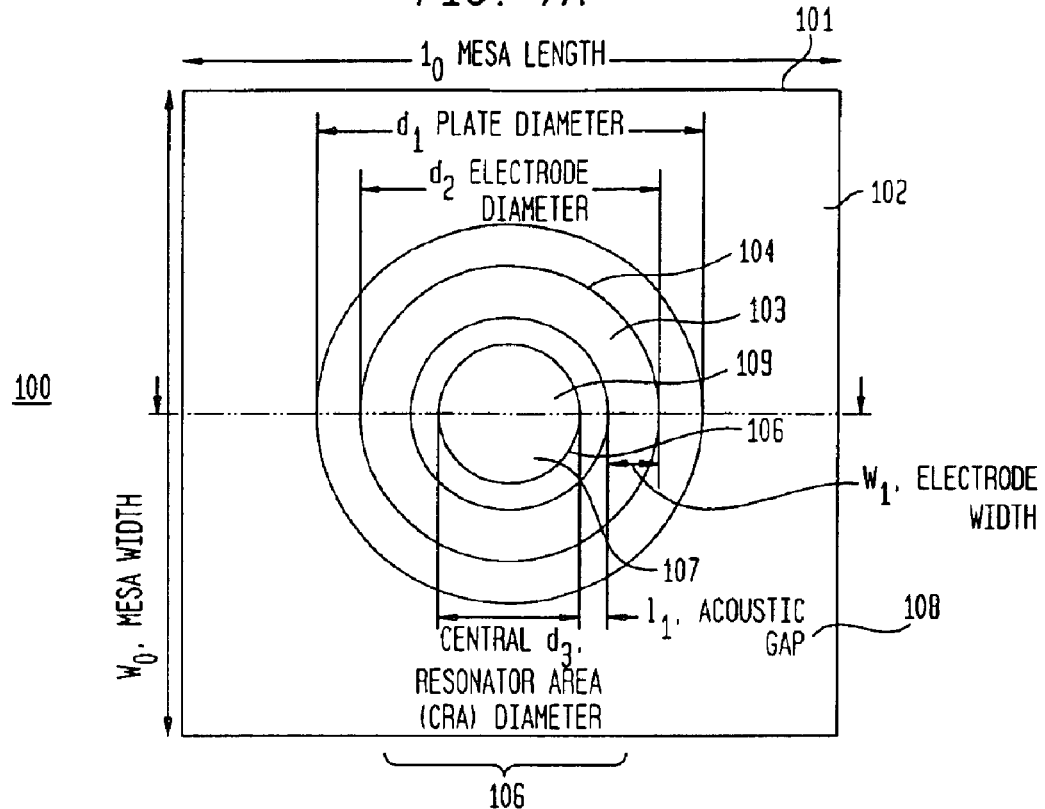
FIGS. 7A–7B are top and cross-sectional views of another electrode-free resonator in accordance with the present invention having a circular resonator area.
Figure 7B:
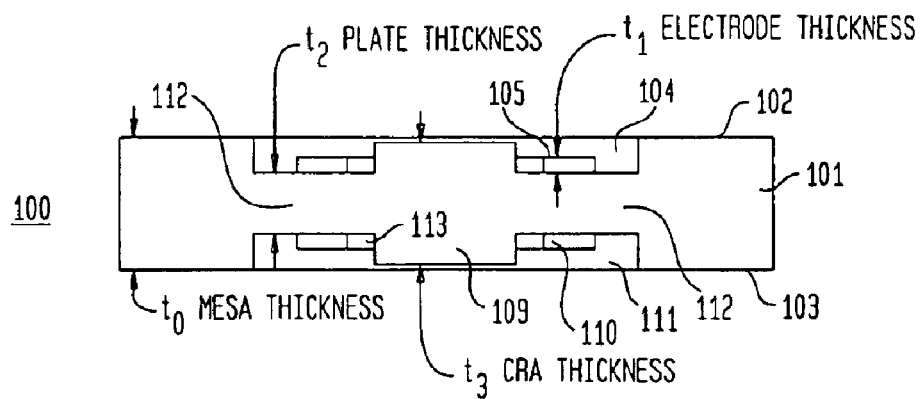

FIGS. 7A–7B are top and cross-sectional views of the MEMS electrode-free ring electrode resonator 100 in accordance with the principles and teachings of the present invention. FIG. 7A depicts MEMS electrode-free ring electrode resonator 100, comprising a double-sided mesa resonator plate 101 with a top surface 102, a top ring electrode 105, a central resonator area ("CRA") 106 and a circular mesa 107 located in the CRA 106. The top ring electrode 105 is disposed in a circular top opening 104 that is shown in FIG. 7B. The top opening 104, top ring electrode 105, CRA 106 and mesa 107 are all circular and concentrically aligned on the top surface 102, and the top ring electrode 105 encircles the mesa 107, allowing the mesa 107 to protrude upwards. A top acoustic gap, $l_1$, 108 separates the top ring electrode 105 and circular mesa 107 and the top ring electrode 105 surrounds the central resonator area 106. Resonator 109 is located in the electrode-free CRA 106. The top and bottom surfaces 102 and 103, respectively, are symmetrical and a plate with a diameter, $d_1$, and thickness, $t_2$, further encircles the top and bottom ring electrodes, 105 and 110, respectively.

FIG. 7B is a side view of the MEMS electrode-free ring electrode resonator 100, using the same numerals for like structures, and depicts the double-sided mesa resonator plate 101, top surface 102, bottom surface 103, the top ring electrode 105 is placed within top opening 104 and a bottom ring electrode 110 is placed within bottom opening 111. The bottom opening 111, bottom ring electrode 110, CRA 106 and mesa 107 are all circular and concentrically aligned on the bottom surface 103, and the bottom ring electrode 110 encircles the mesa 107, allowing the mesa 107 to protrude downwards. Resonator 109 has a resonator thickness dimension, $t_3$, which is measured from the top and bottom resonator portions of CRA 106. FIG. 7B also depicts a vibrating region 112 generally between the top ring electrode 105 and bottom ring electrode 110 and adjacent to the CRA 106. A bottom acoustic gap, $l_1$, 113 separates the bottom ring electrode 110 and resonator 109. Also depicted are the mesa thickness $t_0$, an electrode thickness $t_1$, a plate thickness $t_2$ and CRA thickness dimension, $t_3$. The CRA thickness dimension, $t_3$, primarily determines the resonator frequency.

Representative dimensions for this invention's MEMS electrode-free ring electrode resonator embodiment include a CRA thickness dimension, $t_3$, of 10 μm and diameter, $d_3$, of 200 μm. The thickness of double-sided mesa resonator plate 101, $t_2$, is 9.8 μm and its diameter, $d_2$, is 383 μm. The width of the electrode, $W_1$, is 40 μm and its thickness, $t_1$, is 600 Å. The top and bottom acoustic gaps, $l_1$, 108 and 113, respectively, and the inner radii of the top and bottom electrodes 105 and 110, respectively, measure 1.5 μm. The circular mesa 107 adds more structural integrity to the plate 101, and the mesa thickness, $t_0$, is 25 μm.

The operation of the ring electrode electrode-free resonator 100 is substantially the same as the other embodiments of this invention, with the majority of the trapped energy being confined to the CRA 106, which is done by making the CRA 106 0.2 µm thicker than the resonator plate 101, using a 0.1 µm step on each side. In accordance with the present invention, the CRA 106 acoustically couples to the top and bottom electrodes 105 and 110, respectively, for both sensing and driving. As in the other embodiments, the acoustically coupled top and bottom electrodes 105 and 110, respectively, are controlled by the top and bottom acoustic gaps, $l_1$, 108 and 113, respectively and generate an electromagnetic field between them causing an excitation voltage within vibrating area 112 that generates an acoustic energy within the mesa resonator plate 101, and resonator frequency of the resonator 109 is determined by the CRA thickness dimension, $t_3$.

Several of the variations that apply to the other resonator and filter embodiments also apply to the MEMS electrode-free ring electrode resonator. Additionally, the double-sided mesa resonator plate can be square or rectangular.

It is to be further understood that other features and modifications to the foregoing detailed description are within the contemplation of the present invention, which is not limited by this detailed description. Those skilled in the art will readily appreciate that any number of configurations of the present invention and numerous modifications and combinations of materials, components, configurations, arrangements and dimensions can achieve the results described herein, without departing from the spirit and scope of this invention. Accordingly, the present invention should not be limited by the foregoing description, but only by the appended claims.

What we claim is:

1. A double-sided electrode-free resonator device, comprising:
    a double-sided mesa resonator plate with a top surface, a top well, a mesa, a bottom well and bottom surface;
    a top electrode, being deposited on said top surface and having a top narrow portion and a top wide portion, extends into said top well surrounding said mesa, allowing said mesa to protrude upwards;
    a bottom electrode, being deposited on said bottom surface and having a bottom narrow portion and a bottom wide portion, extends into said bottom well surrounding said mesa, allowing said mesa to protrude downwards;
    said mesa providing an electrode-free resonator area;
    a resonator is provided in said resonator area, said resonator having a top resonator portion, a bottom resonator portion and a resonator thickness dimension, $t_3$, measured from said top resonator portion to said bottom resonator portion;
    an exposed top portion of the mesa situated between said resonator and said resonator area defines a first acoustic gap, $l_4$, and an exposed bottom portion of the mesa situated between said resonator and said resonator area defines a second acoustic gap, $l_4$;
    said top electrode and said bottom electrode, being acoustically coupled and controlled by said first and second acoustic gaps, generate an electro-magnetic field between said electrodes causing an excitation voltage within a vibrating area of said resonator plate, that generates an acoustic energy within said resonator plate; and
    said resonator having a resonator frequency determined by said resonator thickness dimension, $t_3$, said resonator area provides an active element trapping said acoustic energy, causing said acoustic energy to be confined to said resonator area to minimize a leakage of said acoustic energy and provide a high Q factor at 3 GHz.

2. The double-sided electrode-free resonator device, as recited in claim 1, further comprising said top electrode having an electrode length, $l_2$, and an electrode width, $w_2$.

3. The double-sided electrode-free resonator device, as recited in claim 2, further comprising said resonator having a resonator length, $l_3$, and a resonator width, $w_3$.

4. The double-sided electrode-free resonator device, as recited in claim 3, further comprising said bottom electrode being configured the same as said top electrode.

5. The double-sided electrode-free resonator device, as recited in claim 4, further comprising said bottom electrode having said electrode length, $l_2$, and said electrode width, $w_2$.

6. The double-sided electrode-free resonator device, as recited in claim 5, further comprising said electrode length $l_2$ being greater than said resonator length $l_3$.

7. The double-sided electrode-free resonator device, as recited in claim 6, further comprising said electrode width $w_2$ being greater than said resonator width $w_3$.

8. The double-sided electrode-free resonator device, as recited in claim 7, further comprising adjusting said resonator thickness dimension, $t_3$, to vary said resonator frequency.

9. The double-sided electrode-free resonator device, as recited in claim 8, further comprising fabricating said resonator plate with an etching process.

10. The double-sided electrode-free resonator device, as recited in claim 9, further comprising said resonator plate being composed of quartz.

11. The double-sided electrode-free resonator device, as recited in claim 10, wherein said resonator plate is a quartz crystal.

12. A single-side electrode-free resonator device, comprising:
    a single-sided monolithic mesa resonator plate with a top surface, a well, a mesa and a bottom surface;
    a top electrode, being deposited on said top surface, extends into said well surrounding said mesa, allowing said mesa to protrude upwards, and provide an electrode-free resonator area;
    a resonator is provided in said resonator area, said resonator having a resonator thickness dimension, $t_3$, measured from the top of said mesa to said bottom surface;
    a bottom electrode, having a narrow portion and a wide portion, is deposited on said bottom surface;
    an exposed portion of the mesa situated between said resonator and said resonator area defines an acoustic gap, $l_4$;
    said top electrode and said bottom electrode, being acoustically coupled and controlled by said acoustic gap, generate an electro-magnetic field between said electrodes causing an excitation voltage within a vibrating area of said resonator plate, that generates an acoustic energy within said resonator plate; and
    said resonator having a resonator frequency determined by said resonator thickness dimension, $t_3$, said resonator area provides an active element trapping said acoustic energy, causing said acoustic energy to be confined to said resonator area to minimize a leakage of said acoustic energy and provide a high Q factor at 3 GHz.

13. The single-sided electrode-free resonator device, as recited in claim 12, further comprising said top electrode having an electrode length, $l_2$, and an electrode width, $w_2$.

14. The single-sided electrode-free resonator device, as recited in claim 13, further comprising said resonator having a resonator length, $l_3$, and a resonator width, $w_3$.

15. The single-sided electrode-free resonator device, as recited in claim 14, further comprising said bottom electrode having said electrode length, $l_2$, and said electrode width, $w_2$.

16. The single-sided electrode-free resonator device, as recited in claim 15, further comprising said electrode length $l_2$ being greater than said resonator length $l_3$.

17. The single-sided electrode-free resonator device, as recited in claim 16, further comprising said electrode width $w_2$ being greater than said resonator width $w_3$.

18. The single-sided electrode-free resonator device, as recited in claim 17, further comprising adjusting said resonator thickness dimension, $t_3$, to vary said resonator frequency.

19. The single-sided electrode-free resonator device, as recited in claim 18, further comprising fabricating said resonator plate with an etching process.

20. The single-sided electrode-free resonator device, as recited in claim 19, further comprising said resonator plate being composed of quartz.

21. The single-sided electrode-free resonator device, as recited in claim 20, wherein said resonator plate is a quartz crystal.

22. A double-sided electrode-free filter device, comprising:
 a double-sided mesa resonator plate with a top surface, a top well, a plurality of mesas, a bottom well and a bottom surface;
 a top electrode, being deposited on said top surface and having a top narrow portion and a top wide portion, extends into said top well surrounding said plurality of mesas, allowing said plurality of mesas to protrude upwards;
 a bottom electrode, being deposited on said bottom surface and having a bottom narrow portion and a bottom wide portion, extends into said bottom well surrounding said plurality of mesas, allowing said plurality of mesas to protrude downwards;
 said plurality of mesas providing an electrode-free resonator area;
 a plurality of filters are provided on each of said plurality of mesas and are separated by a resonator gap, $l_7$, each of said plurality of filters having a top filter portion, a bottom filter portion and a resonator thickness dimension, $t_3$, measured from said top filter portion to said bottom filter portion;
 an exposed top portion of each of plurality of mesas situated between each of said plurality of filters and said resonator area defines a top acoustic gap, $l_4$, and an exposed bottom portion of each of the plurality of mesas situated between each of said filters and said resonator area defines a bottom acoustic gap, $l_4$;
 said top electrode and said bottom electrode, being acoustically coupled and controlled by said top and bottom acoustic gaps, $l_4$, generate an electro-magnetic field between said electrodes, causing an excitation voltage within a vibrating area of said resonator plate that generates an acoustic energy within said resonator plate; and
 each of said plurality of filters having a resonator frequency determined by said resonator thickness dimension, $t_3$, said resonator area provides an active element trapping said acoustic energy, causing said acoustic energy to be confined to said resonator area to minimize a leakage of said acoustic energy and provide a high Q factor at 3 GHz.

23. The double-sided electrode-free filter device, as recited in claim 22, further comprising said top electrode having an electrode length, $l_2$, and an electrode width, $w_2$.

24. The double-sided electrode-free filter device, as recited in claim 23, further comprising said plurality of filters having a resonator length, $l_3$, and a resonator width, $w_3$.

25. The double-sided electrode-free filter device, as recited in claim 24, further comprising said bottom electrode having said electrode length, $l_2$, and said electrode width, $w_2$.

26. The double-sided electrode-free filter device, as recited in claim 25, further comprising said electrode length $l_2$ being greater than said resonator length $l_3$.

27. The double-sided electrode-free filter device, as recited in claim 26, further comprising said electrode width $w_2$ being greater than said resonator width $w_3$.

28. The double-sided electrode-free filter device, as recited in claim 27, further comprising adjusting said resonator thickness dimension, $t_3$, to vary said resonator frequency.

29. The double-sided electrode-free filter device, as recited in claim 28, wherein said plurality of filters is two filters.

30. The double-sided electrode-free filter device, as recited in claim 29, further comprising fabricating said resonator plate with an etching process.

31. The double-sided electrode-free filter device, as recited in claim 30, further comprising said resonator plate being composed of quartz.

32. The double-sided electrode-free filter device, as recited in claim 31, wherein said resonator plate is a quartz crystal.

33. A single-sided electrode-free filter device, comprising:
 a single-sided monolithic mesa resonator plate with a top surface, a well, a plurality of mesas and a bottom surface;
 a top electrode, being deposited on said top surface, extends into said well surrounding said plurality of mesas, allowing said plurality of mesas to protrude upwards, and provide an electrode-free resonator area;
 a plurality of filters are provided on each of said plurality of mesas and are separated by a resonator gap, $l_7$;
 each of said plurality of filters having a resonator thickness dimension, $t_3$, measured from the tops of said plurality of mesas to said bottom surface;
 a bottom electrode, having a narrow portion and a wide portion, is deposited on said bottom surface;
 an exposed portion of each of said plurality of mesas being situated between said plurality of filters and said resonator area define an acoustic gap, $l_4$;
 said top electrode and said bottom electrode, being acoustically coupled and controlled by said acoustic gap, $l_4$, generate an electro-magnetic field between said electrodes, causing an excitation voltage within a vibrating area of said resonator plate that generates an acoustic energy within said resonator plate; and
 each of said plurality of filters having a resonator frequency determined by said resonator thickness dimension, $t_3$, said resonator area provides an active element trapping said acoustic energy, causing said acoustic energy to be confined to said resonator area to minimize a leakage of said acoustic energy and provide a high Q factor at 3 GHz.

34. The single-sided electrode-free filter device, as recited in claim 33, further comprising said top electrode having an electrode length, $l_2$, and an electrode width, $w_2$.

35. The single-sided electrode-free filter device, as recited in claim 34, further comprising said plurality of filters having a resonator length, $l_3$, and a resonator width, $w_3$.

36. The single-sided electrode-free filter device, as recited in claim 35, further comprising said bottom electrode having said electrode length, $l_2$, and said electrode width, $w_2$.

37. The single-sided electrode-free filter device, as recited in claim 36, further comprising said electrode length $l_2$ being greater than said resonator length $l_3$.

38. The single-sided electrode-free filter device, as recited in claim 37, further comprising said electrode width $w_2$ being greater than said resonator width $w_3$.

39. The single-sided electrode-free filter device, as recited in claim 38, further comprising adjusting said resonator thickness dimension, $t_3$, to vary said resonator frequency.

40. The single-sided electrode-free filter device, as recited in claim 39, wherein said plurality of filters is two filters.

41. The single-sided electrode-free filter device, as recited in claim 40, further comprising fabricating said resonator plate with an etching process.

42. The single-sided electrode-free filter device, as recited in claim 41, further comprising said resonator plate being composed of quartz.

43. The single-sided electrode-free filter device, as recited in claim 42, wherein said resonator plate is a quartz crystal.

44. A MEMS electrode-free ring electrode resonator, comprising:

a double-sided mesa resonator plate with a top surface, a top opening, a mesa, a bottom surface and a bottom opening;

a top ring electrode is disposed in said top opening, said top opening, said top ring electrode and said mesa being circular and concentrically aligned on said top surface, said top opening encircles said mesa, allowing said mesa to protrude upwards;

a top acoustic gap, $l_1$, separates said top ring electrode and said mesa;

a bottom ring electrode is disposed in said bottom opening, said bottom opening, said bottom ring electrode and said mesa being circular and concentrically aligned on said bottom surface, said bottom opening encircles said mesa, allowing said mesa to protrude downwards;

a bottom acoustic gap, $l_1$, separates said bottom ring electrode and said mesa;

said mesa defines a central electrode-free resonator area;

a resonator is located in said central resonator area, said central resonator area having a top resonator portion, a bottom resonator portion and a central resonator area thickness dimension, $t_3$, measured from said top resonator portion to said bottom resonator portion;

said central resonator area thickness dimension, $t_3$, being greater than a plate thickness dimension, $t_2$, measured from said top opening to said bottom opening;

said top ring electrode and said bottom ring electrode, being acoustically coupled and controlled by said top and bottom acoustic gaps, generate an electro-magnetic field between said electrodes causing an excitation voltage within a vibrating area of said mesa resonator plate that generates an acoustic energy within said mesa resonator plate; and said resonator having a resonator frequency determined by said central resonator area thickness dimension, $t_3$, said central resonator area provides an active element trapping said acoustic energy, causing said acoustic energy to be confined to said central resonator area to minimize a leakage of said acoustic energy and provide a high Q factor at 3 GHz.

45. The MEMS electrode-free ring electrode resonator, as recited in claim 44, further comprising said top electrode having an electrode diameter, $d_2$, and an electrode width, $w_1$.

46. The MEMS electrode-free ring electrode resonator, as recited in claim 45, further comprising said central resonator area having a central resonator area diameter, $d_3$, and said central resonator thickness, $t_3$.

47. The MEMS electrode-free ring electrode resonator, as recited in claim 46, further comprising said bottom ring electrode having said electrode diameter, $d_2$, and said electrode width, $w_1$.

48. The MEMS electrode-free ring electrode resonator, as recited in claim 47, further comprising said bottom ring electrode having said electrode diameter, $d_2$, and said electrode width, $w_1$.

49. The MEMS electrode-free ring electrode resonator, as recited in claim 48, further comprising adjusting said central resonator area thickness dimension, $t_3$, to vary said resonator frequency.

50. The MEMS electrode-free ring electrode resonator, as recited in claim 49, further comprising fabricating said mesa resonator plate with an etching process.

51. The MEMS electrode-free ring electrode resonator, as recited in claim 50, further comprising, said resonator plate being composed of quartz.

52. The MEMS electrode-free ring electrode resonator, as recited in claim 51, wherein said resonator plate is a quartz crystal.

53. The MEMS electrode-free ring electrode resonator, as recited in claim 52, further comprising, said double-sided mesa resonator plate being rectangular.

54. The MEMS electrode-free ring electrode resonator, as recited in claim 53, further comprising, said double-sided mesa resonator plate being square.

* * * * *

UNITED STATES PATENT AND TRADEMARK OFFICE
CERTIFICATE OF CORRECTION

| | | |
|---|---|---|
| PATENT NO. | : 6,903,629 B1 | Page 1 of 1 |
| APPLICATION NO. | : 10/669282 | |
| DATED | : June 7, 2005 | |
| INVENTOR(S) | : Arthur Ballato, John R. Vig and Yook-Kong Yong | |

It is certified that error appears in the above-identified patent and that said Letters Patent is hereby corrected as shown below:

IN THE CLAIMS:

Column 14, Claim 47.

Correct claim 47 to read

--47. The MEMS electrode-free ring electrode resonator, as recited in claim 46, further comprising said bottom ring electrode being configured the same as said top ring electrode.--

Signed and Sealed this

Tenth Day of April, 2007

JON W. DUDAS
*Director of the United States Patent and Trademark Office*